(12) United States Patent
Yost et al.

(10) Patent No.: US 9,034,216 B2
(45) Date of Patent: May 19, 2015

(54) WET-CHEMICAL SYSTEMS AND METHODS FOR PRODUCING BLACK SILICON SUBSTRATES

(75) Inventors: Vernon Yost, Lakewood, CO (US); Hao-Chih Yuan, Golden, CO (US); Matthew Page, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 92 days.

(21) Appl. No.: 13/825,541

(22) PCT Filed: Nov. 11, 2010

(86) PCT No.: PCT/US2010/056417
§ 371 (c)(1),
(2), (4) Date: Mar. 21, 2013

(87) PCT Pub. No.: WO2011/060193
PCT Pub. Date: May 19, 2011

(65) Prior Publication Data
US 2013/0234072 A1    Sep. 12, 2013

Related U.S. Application Data

(60) Provisional application No. 61/260,179, filed on Nov. 11, 2009.

(51) Int. Cl.
*H01B 1/02* (2006.01)
*H01B 1/22* (2006.01)
(Continued)

(52) U.S. Cl.
CPC ............ *H01L 21/30604* (2013.01); *H01B 1/00* (2013.01); *H01L 21/67086* (2013.01); *H01L 31/1804* (2013.01); *Y02E 10/547* (2013.01)

(58) Field of Classification Search
CPC ............ G01N 2030/326; G03F 7/0397; G03F 7/0757; B82Y 30/00; C08F 220/18; H01B 1/00
USPC ............................................. 216/99; 252/514
See application file for complete search history.

(56) References Cited

U.S. PATENT DOCUMENTS 3,874,956 A * 4/1975 Gamo et al. .................. 438/139
4,111,762 A   9/1978 Wade et al.
(Continued)

FOREIGN PATENT DOCUMENTS

JP    2000261008    9/2000
JP    2005277208    6/2005
(Continued)

OTHER PUBLICATIONS

Branz et al., "Nanostructured Black Silicon and the Optical Reflectance of Graded-Density Surfaces," Applied Physics Letters vol. 94, Issue 23, Jun. 2009, pp. 231121 (1-3).
(Continued)

*Primary Examiner* — Mark Kopec
*Assistant Examiner* — William Young
(74) *Attorney, Agent, or Firm* — John C. Stolpa; Suzanne C. Walts; Michael A. McIntyre

(57) ABSTRACT

A wet-chemical method of producing a black silicon substrate. The method comprising soaking single crystalline silicon wafers in a predetermined volume of a diluted inorganic compound solution. The substrate is combined with an etchant solution that forms a uniform noble metal nanoparticle induced Black Etch of the silicon wafer, resulting in a nanoparticle that is kinetically stabilized. The method comprising combining with an etchant solution having equal volumes acetonitrile/acetic acid:hydrofluoric acid:hydrogen peroxide.

19 Claims, 6 Drawing Sheets

(51) Int. Cl.
*H01L 21/306* (2006.01)
*H01L 21/67* (2006.01)
*H01L 31/18* (2006.01)
*H01B 1/00* (2006.01)

(56) References Cited

U.S. PATENT DOCUMENTS

| | | | |
|---|---|---|---|
| 5,196,088 | A | 3/1993 | Soda |
| 5,250,460 | A * | 10/1993 | Yamagata et al. ............ 438/458 |
| 5,264,375 | A | 11/1993 | Bang et al. |
| 6,093,941 | A | 7/2000 | Russell et al. |
| 6,178,033 | B1 | 1/2001 | Ford et al. |
| 6,284,317 | B1 | 9/2001 | Laibinis et al. |
| 6,329,296 | B1 | 12/2001 | Ruby et al. |
| 6,538,801 | B2 | 3/2003 | Jacobson et al. |
| 6,721,083 | B2 | 4/2004 | Jacobson et al. |
| 6,759,313 | B2 | 7/2004 | Yamazaki et al. |
| 6,762,134 | B2 | 7/2004 | Bohn et al. |
| 6,790,785 | B1 | 9/2004 | Li et al. |
| 6,899,816 | B2 | 5/2005 | Padhi et al. |
| 6,905,622 | B2 | 6/2005 | Padhi et al. |
| 7,090,783 | B1 | 8/2006 | Cui et al. |
| 7,135,414 | B2 | 11/2006 | Matsumura et al. |
| 7,141,490 | B2 | 11/2006 | Yamazaki et al. |
| 7,476,573 | B2 | 1/2009 | Cohen |
| 7,585,786 | B2 | 9/2009 | Goo et al. |
| 7,718,254 | B2 | 5/2010 | Matsumura et al. |
| 8,053,270 | B2 | 11/2011 | Dimitrov et al. |
| 8,053,328 | B2 | 11/2011 | Cohen |
| 8,075,792 | B1 | 12/2011 | Branz et al. |
| 8,119,438 | B2 | 2/2012 | Nishimoto |
| 8,124,535 | B2 | 2/2012 | Lin et al. |
| 8,193,095 | B2 | 6/2012 | Lin et al. |
| 8,334,216 | B2 | 12/2012 | Lin et al. |
| 8,486,843 | B2 | 7/2013 | Li et al. |
| 2002/0068421 | A1 | 6/2002 | Yamazaki et al. |
| 2002/0104552 | A1 | 8/2002 | Bay |
| 2002/0123227 | A1 | 9/2002 | Winningham et al. |
| 2002/0145792 | A1 | 10/2002 | Jacobson et al. |
| 2003/0096113 | A1 | 5/2003 | Jacobson et al. |
| 2003/0119332 | A1 | 6/2003 | Kuebelbeck et al. |
| 2003/0190812 | A1 | 10/2003 | Padhi et al. |
| 2004/0100594 | A1 | 5/2004 | Huibers et al. |
| 2004/0100677 | A1 | 5/2004 | Huibers et al. |
| 2004/0241967 | A1 | 12/2004 | Yamazaki et al. |
| 2005/0056118 | A1 | 3/2005 | Xia et al. |
| 2005/0101153 | A1 | 5/2005 | Matsumura et al. |
| 2005/0130439 | A1 | 6/2005 | Goo et al. |
| 2005/0137531 | A1 | 6/2005 | Prausnitz et al. |
| 2005/0271805 | A1 | 12/2005 | Kambe et al. |
| 2006/0281333 | A1 | 12/2006 | Shin et al. |
| 2006/0281334 | A1 | 12/2006 | Shin et al. |
| 2007/0121205 | A1 | 5/2007 | Miles |
| 2007/0148922 | A1 | 6/2007 | Yamazaki et al. |
| 2007/0152234 | A1 | 7/2007 | Yamamoto et al. |
| 2007/0155021 | A1 | 7/2007 | Zhang et al. |
| 2007/0155022 | A1 | 7/2007 | Yamakawa et al. |
| 2007/0184576 | A1 | 8/2007 | Chang et al. |
| 2007/0190326 | A1 | 8/2007 | Perry et al. |
| 2007/0206267 | A1 | 9/2007 | Tung et al. |
| 2007/0247620 | A1 | 10/2007 | Koo |
| 2007/0281249 | A1 | 12/2007 | Tutt et al. |
| 2009/0183776 | A1 | 7/2009 | Kwag et al. |
| 2009/0236317 | A1 * | 9/2009 | Yost et al. ........................ 216/99 |
| 2009/0293946 | A1 | 12/2009 | Lin et al. |
| 2010/0248449 | A1 | 9/2010 | Hildreth et al. |
| 2010/0270263 | A1 | 10/2010 | Li et al. |
| 2010/0270650 | A1 | 10/2010 | Li et al. |
| 2010/0296986 | A1 * | 11/2010 | Feyh ............................ 422/534 |
| 2011/0030610 | A1 | 2/2011 | Kamian et al. |
| 2011/0045627 | A1 | 2/2011 | Sachs et al. |
| 2011/0143484 | A1 | 6/2011 | Lin et al. |
| 2011/0303265 | A1 | 12/2011 | Yuan et al. |
| 2011/0316134 | A1 | 12/2011 | Tsao et al. |
| 2012/0024365 | A1 | 2/2012 | Branz et al. |
| 2012/0088372 | A1 | 4/2012 | Chien et al. |
| 2012/0103825 | A1 | 5/2012 | Oh et al. |
| 2012/0178204 | A1 | 7/2012 | Toor et al. |
| 2012/0225517 | A1 | 9/2012 | Zhang et al. |
| 2013/0052762 | A1 | 2/2013 | Li et al. |

FOREIGN PATENT DOCUMENTS

| | | |
|---|---|---|
| JP | 2005183505 | 7/2005 |
| JP | 2007305748 | 11/2007 |
| JP | 2009209420 | 9/2009 |
| WO | 2003105209 | 12/2003 |
| WO | 2005059985 | 6/2005 |
| WO | 2006051727 | 5/2006 |
| WO | 2007083152 | 7/2007 |
| WO | 2007025536 | 8/2007 |
| WO | 2009117642 | 9/2009 |
| WO | 2011060193 | 5/2011 |
| WO | 2011161479 | 12/2011 |

OTHER PUBLICATIONS

Yuan, et al., "Efficient Black Sikocon Solar Cell With a Density-Graded Nanoporous Surface; Optical Properties, Performance Limitations, and Design Rules," Applied Physics Letters vol. 95, Issue 12, Sep. 2009, pp. 123501 (1-3).
Toor et al.,"Multi-Surface Texture to Improve Blue Response of Nanoporous Black Silicon Solar Cells," Applied Physics Letters vol. 99, Issue 10, Sep. 2011, pp. 10103501 (1-3).
Lee, et al., "Extremely Superhydrophobic Surfaces With Micro- and Nanostructures Fabricated by Copper Catalytice Etching," Langmuir Article, vol. 27, Issue 2, Jan. 18, 2011, pp. 809-814.
Huang et al., "Metal-Assited Electrochemical Etching of Silicon," Nanotechnology, vol. 21, Nov. 19, 2010 pp. 465301 (1-6).
Peng et al., "Fabrication of Single-Crystalline Silicon Nanowires y Scratching a Silicon Surface With Catalytic Metal Particles," Advanced Functional Materials, vol. 16, Issue 3, Feb. 2006, pp. 387-394.
Lee at al., "Patterning of Various Silicon Structures Via Polymer Lithography and Catalytic Chemical Etching," Nanotechnology, vol. 22, Issue 27, Jul. 8, 2011, pp. 275305 (1-6).
Liu et al., "Efficient SERS Substrates Made by Electroless Silver Deposition Into Patterned Silicon Structures," Journal of Material Chemistry, vol. 14, Issue 10, Apr. 21, 2004 (1st published on line), pp. 1526-1532.
Tsujino et al., "Texturization of Multicyrstalline Silicon Wafers For Solar Cells by Chemical Treatment Using Metallic Catalyst," Solar Energy Materials & Solar Cells, vol. 90, Issue 1, Jan. 2006, pp. 100-110.
Li et al., "Metal-Assisted Chemical Etching in HF/H2O2 Procedures Porous Silicon," Applied Physics Letters vol. 77, Issue16, Oct. 2000, pp. 2573-2574.
Nishioka et al., "Antireflection Subwavelength Structure of Silicon Surface Formed by Wet Process Using Catalysis of Single Nano-sized Gold Particle," Solar Energy Materials and Solar Cells, vol. 92, Issue 8, Aug. 2008, pp. 919-922.
Putnam et al., "10um minority-carrier diffusion lengths in Si Wires snythesized by Cu-catalyzed vapor-liquid-solid growth," Applied Physics Letters, vol. 95, Issue 16, Oct. 19, 2009, pp. 163116-1-163116-3.
Kuzuma-Filipek et al., ">16% thin-film epitaxial silicon solar cells on 70-cm2 area with 30-us active layer, porous silicon back reflector, and Cu-based top-contact metallization," Progress in Photovoltaics: research and applications, vol. 20, Issue 3, May 2012, pp. 350-355.
Nishioka et al, "Nano-sized Taper Structure Formed by Wet Process Using Catalysis of God Nanoparticle," School of Material Science, Japan Advanced Institute of Science and Technology, 2007.
Koynov et al., "Black multi-crystalline silicon solar cells," Rapid Research Letters, vol. 1, Issue 2, Mar. 2007, pp. R53-R55.
Koynov et al, "Black nonreflecting silicon surfaces for solar cells," Applied Physics Letter, vol. 88, Issue 30, May 2006, pp. 203107-1-.
PCT/US10/56417 International Search Report and Written Opinion dated Jan. 25, 2011.

(56) References Cited

OTHER PUBLICATIONS

PCT/US09/37776 International Search Report and Written Opinion dated Sep. 28, 2009.

PCT/US09/37776 International Preliminary Report on Patentability dated Sep. 21, 2010.

PCT/US13/30257 International Search Report and Written Opinion dated May 16, 2013.

Japanese Application No. 500974/2011 Office Action dated Mar. 13, 2012 with English translation.

Chinese Application No. 200980110274.3 Office Action dated Dec. 25, 2012 with English translation.

Chinese Application No. 200980110274.3 Office Action dated Jun. 27, 2013 with English translation.

Kumaravelu et al., Surface Texturing for Silicon Solar Cells Using Reactive Ion Etching Technique.

* cited by examiner

400

500

WET-CHEMICAL SYSTEMS AND METHODS FOR PRODUCING BLACK SILICON SUBSTRATES

CROSS REFERENCE TO RELATED PATENT APPLICATION

This application claims priority to U.S. Provisional Patent Application No. 61/260,179, filed on Nov. 11, 2009 and entitled "Wet-Chemical Systems and Methods for Producing Black Silicon Substrates" by Yost et. al., hereby incorporated by reference as if fully set forth herein.

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

TECHNICAL FIELD

The described subject matter relates to wet-chemical systems and methods for producing black silicon substrates, and to black silicon substrates with reduced reflective losses.

BACKGROUND

Reflection of incident light reduces the efficiency (photocurrent) of silicon solar cells. Without antireflection, about 40% of sunlight is lost. This anti-reflection must be effective across the entire solar spectrum and at a wide variety of incident sunlight angles. Acceptance of light from a broad range of angles aids in capturing morning, afternoon, and diffuse scattered light. These same antireflection properties are also useful in silicon-based optical detectors.

Presently, antireflection on crystal silicon photovoltaics is achieved through several different techniques, but none is completely satisfactory. Anisotropic (pyramidal) texture etching of single crystal silicon reduces reflectivity to about 5-15% on 100-oriented single-crystal silicon, but mainly for light incident at angles near 90° and not for low incident angles. This technique also consumes a lot of silicon material, making it impractical for film silicon photovoltaics. On other forms of silicon and silicon solar cells, deposited, quarter-wavelength films of ITO, $SiO_x$, $SiN_x$ or other materials are used to reduce reflectivity, but the effect is based on interference and therefore tuned to a specific wavelength and is not necessarily effective across the entire solar spectrum. Averaged across the solar spectrum, reflection can be reduced to about 5-15%. Lower-reflection approaches that work effectively at all incident angles are still needed.

Previous black silicon etching approaches result in low reflectivity across the entire solar spectrum and a wide range of angles of incidence, but the gold evaporation step is expensive to implement and difficult to control.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Exemplary embodiments are disclosed for the use of chlorauric acid ($HAuCl_4$) to replace the evaporated gold layer of current art. Exemplary embodiments are also disclosed for the use of organic modifiers to alter the activity of ions in solution. Mixing these ions into the solution instead of pre-depositing a gold layer aids the production of black silicon surfaces via an in-situ reduction of $HAuCl_4$ to gold nanoparticles of about 5-10 nm in size.

Performing the etch procedure after the phosphorus diffusion of the silicon surface to preserve minority carrier lifetime is also advantageous. The black silicon etching approach results in low reflectivity across the entire solar spectrum and a wide range of angles of incidence with the ability to texture heavily phosphorus-doped silicon wafers, which offers process flexibility and avoids costly minority carrier lifetime damage. Exemplary embodiments are disclosed herein for several wet-chemical methods for the production of Si surfaces that exhibit nearly complete suppression of reflectivity in the range of about 350-1000 nm wavelength.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Figure 1:
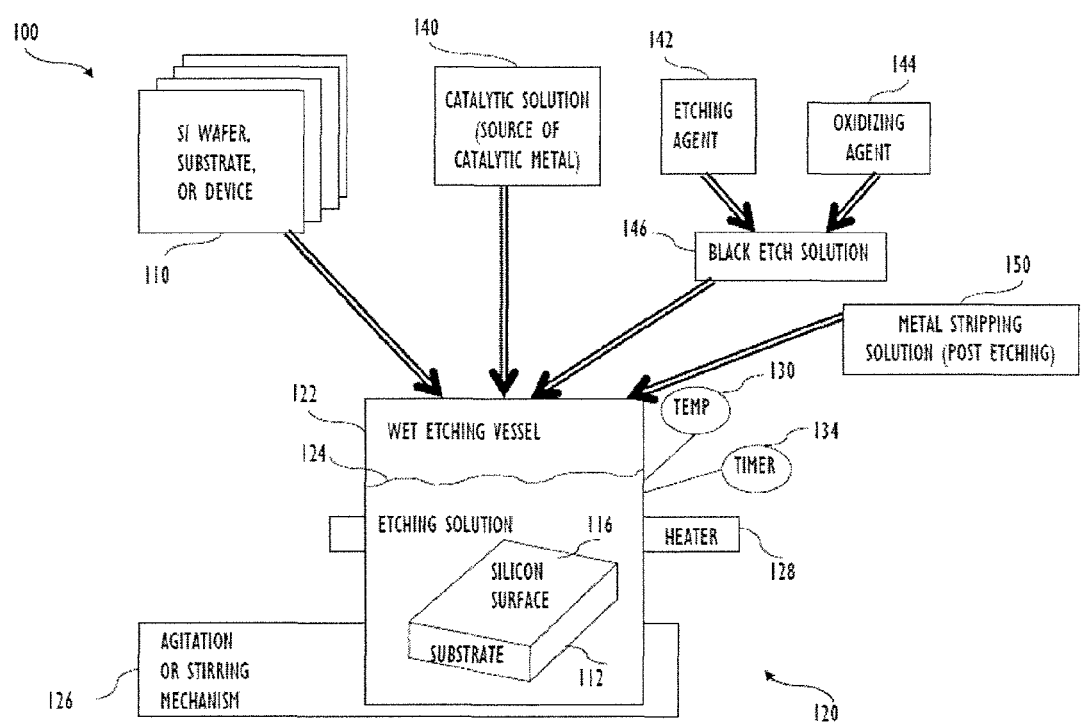
FIG. 1 illustrates an etching system for use in texturing silicon surfaces using catalytic solutions, with catalytic metal molecules or ionic species of catalytic material, and an oxidant-etchant solution.

Briefly, wet-chemical methods for producing black silicon substrates are disclosed. Exemplary embodiments are disclosed herein for several wet-chemical methods for the production of Si surfaces that exhibit nearly complete suppression of reflectivity in the range of about 350-1000 nm wavelength. Exemplary embodiments provide a simple way to get the benefits of "black silicon" and reduce reflective losses to below 3% across the "useful" solar spectrum and over a wide range of incident angles with the ability to texture a heavily phosphorus-doped wafer, which offers process flexibility during solar cell fabrication. Exemplary embodiments are disclosed for the use of chlorauric acid to replace the evaporated gold layer of current art and the use of organic modifiers to alter the activity of ions in solution. Mixing these ions into the solution instead of predepositing a gold layer is advantageous for the production of black silicon surfaces via an in-situ reduction of $HAuCl_4$ to gold nanoparticles of about 5-10 nm in size.

The soaking of single crystalline silicon wafers, which have been heavily doped with n-type dopant phosphorus, from phosphorous oxychloride ($POCl_3$) gaseous diffusion at about 950° C. for one hour, in a given volume of dilute (0.4 mM) solution of chlorauric acid when combined with an etchant solution comprised of equal volumes (1:1:1) of 50/50 vol % acetonitile/acetic acid:50 wt./vol. % hydrofluoric acid:30 wt./vol/% hydrogen peroxide provides a kinetically stabilized and uniform gold-nanoparticle induced Black Etch of the n-doped silicon surface within approximately four minutes. The function of the acetic acid is to provide a hydrophyllic hydrogen-bonded environment which accelerates the oxidation of the silicon surface, while the acetonitrile acts as a dissociaton limiter for the hydrofluoric acid and prevents the loss of too much of the diffused silicon layer which may compromise the n-p junction. It is noted that the soaking can be performed in the same time after the addition of the 0.4 mM chlorauric acid solution.

Exemplary embodiments include controlling the hydrophyllicity on silicon surfaces and the activity of hydrofluoric acid/hydrogen peroxide etching solutions by the addition of acetic acid and acetonitrile. Embodiments are disclosed which describe a process-specific repair for unsuccessful attempts to produce nanoporous Black-Silicon on wafers which have already been given a heavily and deep phosphorous diffused p/n junction (e.g., by $POCL_3$). The use of organic HF activity modifier (e.g., acetonitrile) and a silicon-surface hydrophyllicity modifier (e.g., acetic acid) in conjunction with the chlorauric acid ($HAuCl_4$) or like solution, together with a 1:1 mixture of hydrofluoric acid and hydrogen peroxide, enables the successful production of an anti reflective nanoporous layer on an already processed silicon wafer in one step.

The substrates manufactured into devices may be lightly-Boron-doped p-type, dual-side polished, single-crystal Float Zone silicon (100) wafers of approximately 1 to 3 ohm-cm resistivity.

An example of the etching procedure uses very dilute (e.g., less than about 1 mM) solutions of gold ions in the form of $HAuCl_4$ or the like. The time scale for the optimized process was reduced to about 4 minutes in order to obtain both minimum reflectance (e.g., up to about 5%) and the best surface uniformity. Piezoelectric profilometry showed samples of the Black Etch to consume approximately 1000 nm Si in that time.

Exemplary wet-chemical methods for producing black silicon substrates and methods of production thereof may be better understood with reference to the Figures and following discussion.

FIG. 1 illustrates an etching system for use in texturing silicon surfaces using catalytic solutions, with catalytic metal molecules or ionic species of catalytic material, and an oxidant-etchant solution.

The system 100 includes one or more wafers, substrates, or devices 110 with silicon surfaces. These may be Si wafers for solar cells, optoelectronics, or other products. The silicon surface 116 on silicon sample 112 may be mono-crystalline, multi-crystalline, amorphous, or the like, and the type of doping may be varied such as to be n and/or p-type doping of varying levels (such as from about 0.25 ohm-cm to about 50 ohm-cm or the like). The wafer, substrate, or device 110 may have one silicon surface or two or more such surfaces that are etched during operation of system 100.

The system 100 does not require a metal deposition station, but, instead, the system 100 may include an etching assembly 120 with a wet etching vessel or container 122 made of Teflon or high density polyethylene. During operation, one or more of the Si wafers 110 or Si layers on substrate 112 are placed into the vessel 122 before adding a volume of a catalytic solution containing the chosen metal ion along with the organic modifiers, acetic acid and acetonitrile, solution 140. In FIG. 1, a single substrate 112 is shown in the vessel with an exposed silicon surface 116 but a plurality of such surfaces 116 may be etched concurrently.

The assembly 120 includes a mechanism 126 for agitating or stirring the final reaction solution 124 initially and/or during etching. In one example, the mechanism 126 may be a mechanical or magnetic-based stirring device, while in some cases enhanced or more repeatable results are achieved with an ultrasonic agitator or the like for stirring/agitating the final reaction solution 124 by sonication. The assembly 120 may include a heater 128 to maintain or raise the temperature of the final reaction solution 124 within one or more desired temperature ranges to facilitate etching of surface 116. A temperature gauge or thermometer 130 may be provided to monitor the temperature of the solution (and, optionally, provide control feedback signals to heater 128), and a timer 134 may be provided as a visual and/or audio indicator to an operator of the assembly 120 regarding an etching or stripping step.

The system 100 further may utilize a catalytic solution 140 that provides a supply or source of a catalytic metal such as a metal containing molecular or ionic species of a catalytic metal and the organic modifiers, acetic acid and acetonitrile. This source provides a quantity of catalyst for the final reaction solution 124 such as a quantity of a transition or noble metal such as gold, silver, platinum, palladium, copper, nickel, cobalt, and the like. Good results are typically achieved with solutions containing $HAuCl_4$, AgF, and the similar acids or materials that release metal-containing molecules or ionic species of such metals when mixed with the oxidant-etchant solutions 142 and 144, which comprise the Black Etch solution 146 added to vessel 122. Generally, this catalytic solution with a metal catalyst is added to the vessel 122 to make up a portion of the final reaction solution 124. The etching and oxidizing solutions which constitute the balance of the final reaction solution 124 and their makeup are discussed in further detail below.

To achieve etching of the silicon surface 116, the system 100 includes a source for an etching agent 142 and of an oxidizing agent 144. These may be chosen specifically for texturing/etching of silicon, and the etching agent 142 may be HF, $NH_4F$, or other etchant. The oxidizing agent may be $H_2O_2$ or other agent, such as an agent that has its decomposition catalyzed by the metal provided by catalytic solution 140. For example, the oxidizing agent 144 may include $H_2O_2$, $O_3$, $CO_2$, $K_2Cr_2O_7$, $CrO_3$, $KIO_3$, $KBrO_3$, $NaNO_3$, $HNO_3$, $KMnO_4$, or the like or a mixture thereof. These agents (or solutions thereof) 142, 144 may be added separately to the vessel 122 to form the final reaction solution 124 along with the catalytic solution 140 or, as shown, an oxidant-etchant (black-etch) solution 146 may be formed first by combining the etching agent 142 and the oxidizing agent 144 and then putting this solution in the vessel 122. The assembly 120 is then operated such as by agitation via mechanism 126 and heating by heater 128 for a time ("etch time") to texture the surface 116. After the etch time elapses, the solution 124 is removed (or substrate 112 is moved to another container or vessel for de-ionized water rinsing and metal stripping), and remaining metal catalyst is removed, as it may be present as an undesirable impurity in silicon. To this end, the system 100 includes a source of a metal stripping solution 150 that is added to the vessel 122, and the stripping solution may be stirred or agitated (and, optionally, heated with heater 128) by mechanism 126 until all or substantially all of the metal from material 140 is removed from surface 116. The substrate or wafer 112 may then be used as-is or as a component or layer of a larger device such as a solar cell or photovoltaic device, an optoelectronic device, a biomedical device, or other similar devices.

Figure 2:
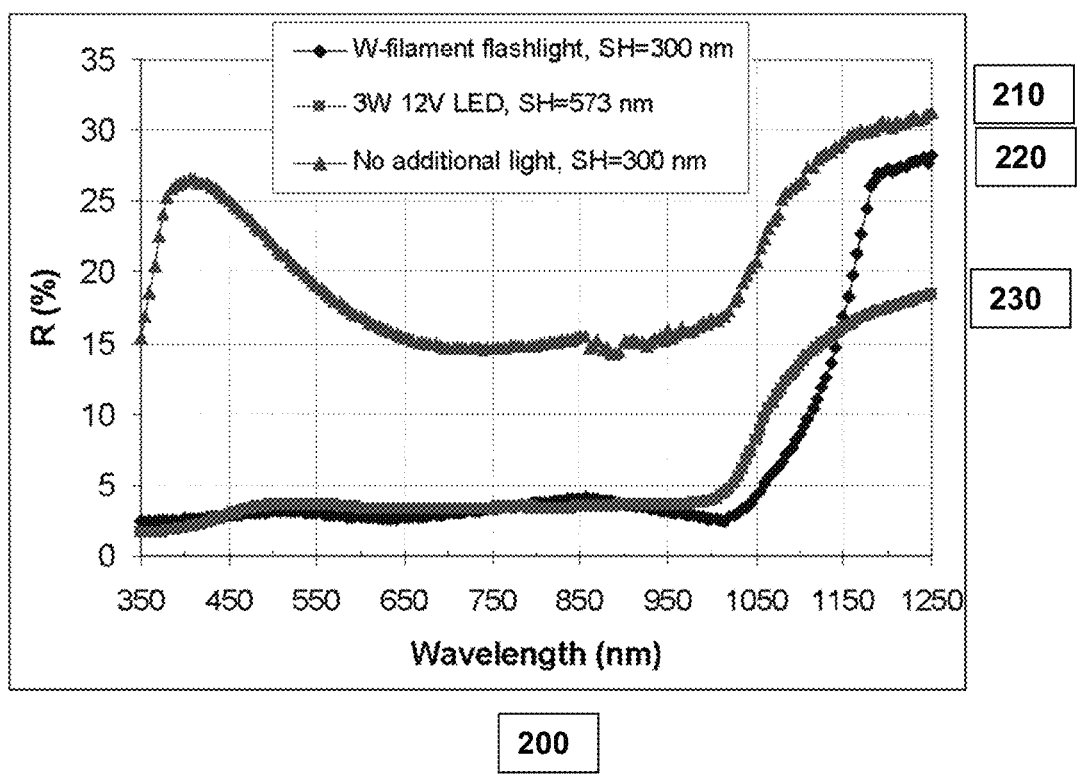
FIG. 2 is a plot of results for an example of Black Etches on a heavily n-diffused silicon wafer with and without additional light sources. Step Height ("SH") data for the amount of silicon removed is also included in the graph.

In FIG. 2, the graph 200 indicates examples of heavily n-diffused silicon wafers induced with Black Etch solutions with and without additional light sources. For example, adding a W-filament flashlight source 210 to the solution resulted in a SH of about 300 nm. Another embodiment utilized a 3 W 12V LED light source 220 resulting in a SH of about 575 nm. The SH without any additional light source 230 was about 300 nm.

Figure 3:
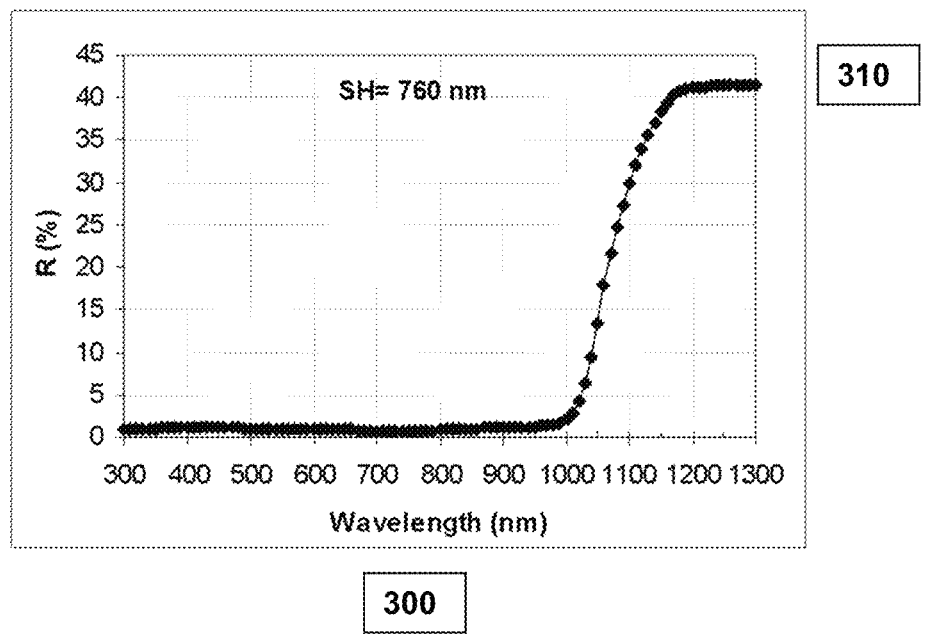
FIG. 3 is a plot of results for an exemplary technique for utilizing the organic modified Black Etch process.

In FIG. 3, the graph 300 shows the results for an exemplary technique for utilizing the organic modified Black Etch process resulting in s SH of about 750 nm.

Figure 4:
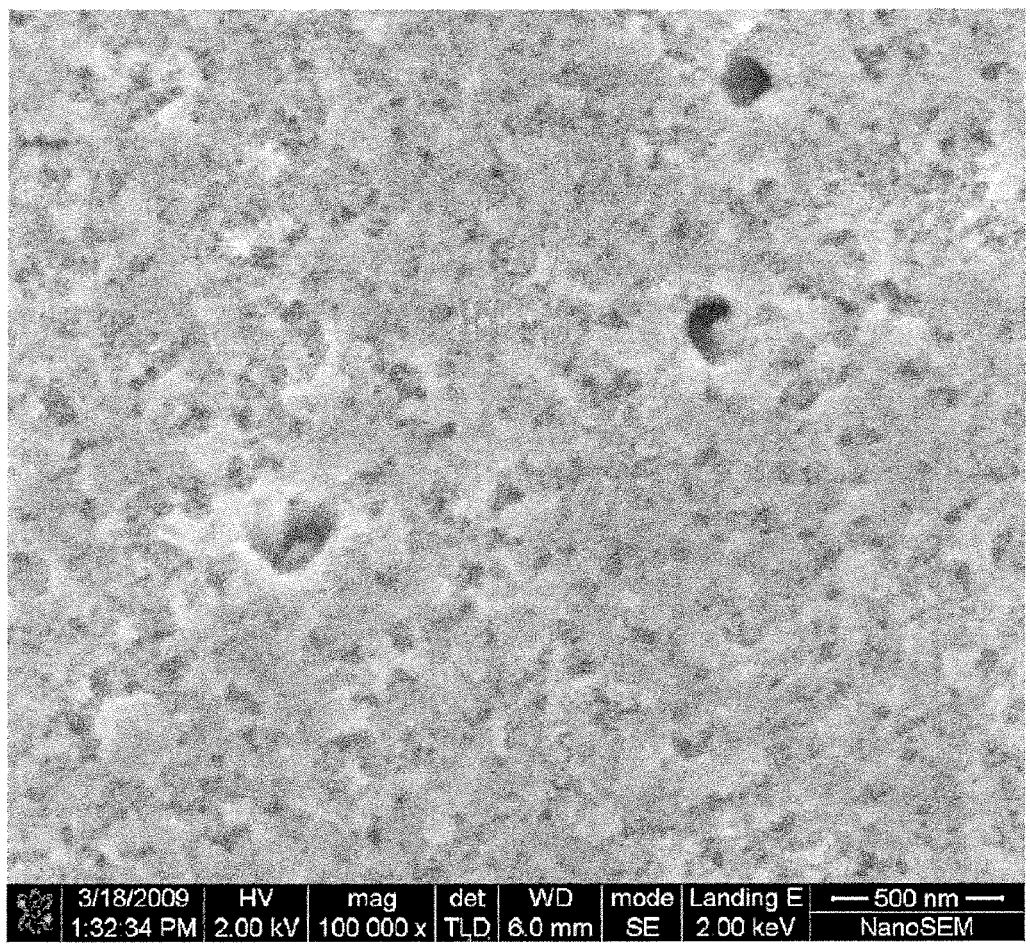
FIG. 4 is a 100,000×SEM (scanning electron microscope) picture of an actual solar cell produced from a deep phosphorous-diffused silicon wafer after organic modified Black Etch process.

FIG. 4 is a 100,000×SEM (scanning electron microscope) picture 400 of an actual solar cell produced from a deep phosphorous-diffused silicon wafer after organic modified Black Etch process.

Figure 5:
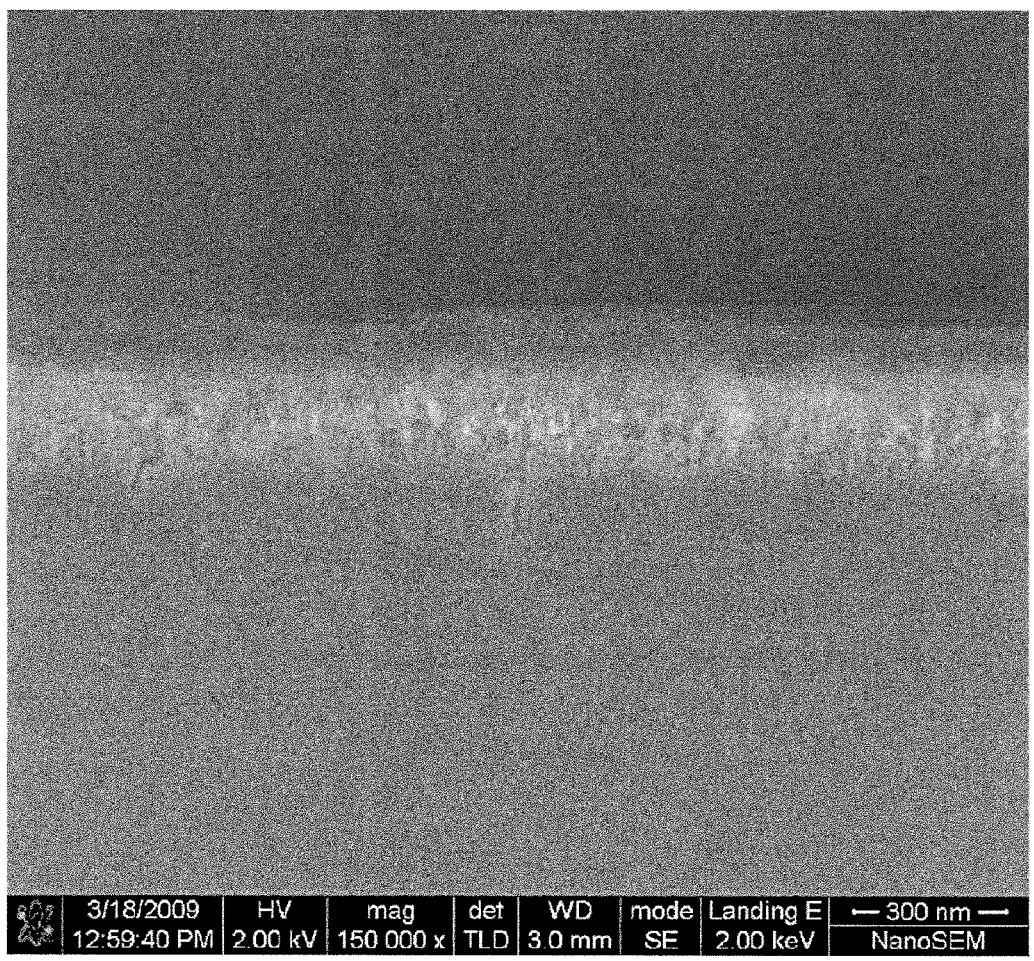
FIG. 5 is a 150,000× cross-sectional SEM picture of an actual solar cell produced from a deep phosphorous-diffused silicon wafer after organic modified Black Etch process.

FIG. 5 is a 150,000× cross-sectional SEM picture 500 of an actual solar cell produced from a deep phosphorous-diffused silicon wafer after organic modified Black Etch process.

Figure 6:
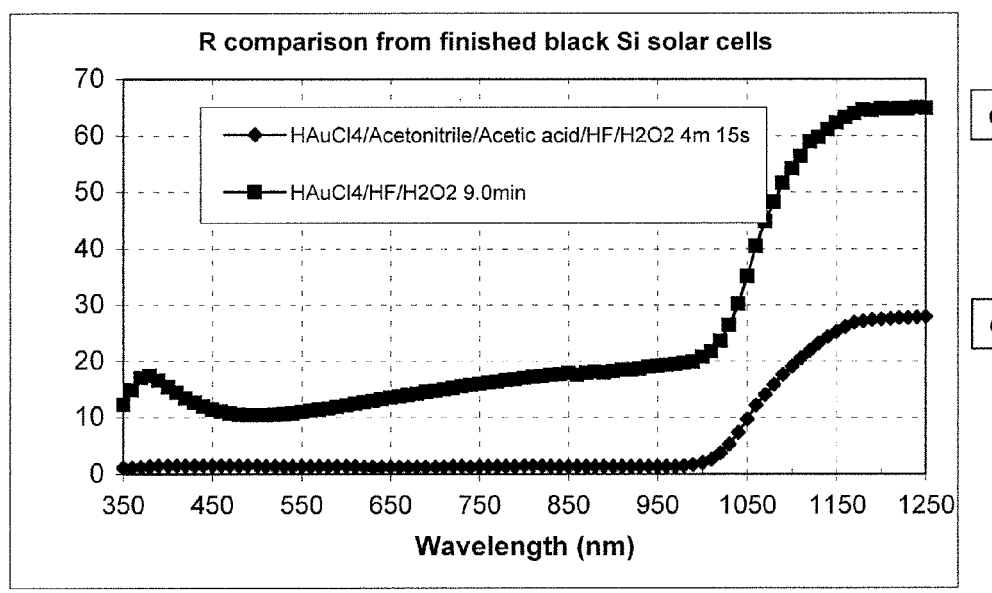
FIG. 6 is a plot of results of a reflectivity comparison between the exemplary Black-Etch techniques on deep phosphorous-diffused silicon wafers.

FIG. 6 is a plot 600 of results of a reflectivity comparison between the exemplary Black-Etch techniques on deep phosphorous-diffused silicon wafers. In one example, the finished black Si solar cells 620 utilized a solution of $HAuCl_4$/Acetonitrile/Acetic acid/HF/$H_2O_2$ that mixed for approximately 4 minutes. In another embodiment, the finished black Si solar cells 610 utilized a solution of $HAuCl_4$/HF/$H_2O_2$ mixed for approximately 9 minutes.

EXAMPLES

In this example, polytetrafluoroethylene (PTFE) or Teflon® lab ware was utilized. The chemicals utilized were clean-room/reagent grade. Gentle swirling of the solution was used for mixing during the reaction, which includes the organic modifiers (acetonitrile and acetic acid). Ultrasonication was utilized for the initial trial of aqueous 26.25% $H_2O_2$, 6.25% HF (7:1 volume ratio) solution, which required additional light sources placed at about 50 mm above the wafer and for about 8-9 minutes to achieve minimum reflectance. It is noted that the use of ultrasonication for the organic-modified reaction results in an excess (>1500 nm) of silicon being etched away. The light source used a 6V tungsten filament lamp and a 3 W, 12-V blue LED.

A 26.25% $H_2O_2$, 6.25% HF (7:1 volume ratio) solution was found to aggressively black-etch (ultrasonicated) HF oxide-stripped silicon and wafers which have been deeply n-doped (i.e. 60 min. at about 950° C. with $POCL_3$). In this case, however, an 8-9 minute Black Etch time performed under high-intensity light with ultrasonic mixing has been found to produce wafers with less than about 5% reflectivity.

The wafers tested were about 0.5 inch square p(boron-doped)-type-Float Zone (FZ), polished on both sides, and approximately 1 to 3 ohm-cm resistivity and a (100) surface orientation. Both sides were subject to about one hour phosphorus diffusion at about 950° C. with $POCl_3$. The phosphorous-silicate glass formed on both sides was removed by 5% aqueous HF for about 10 minutes.

Another example used 2% HF to remove the phosphorous silicate residue following the $POCL_3$ diffusion before the Black-etch with 0.4 mM $HAuCl_4$. Reactive-ion etching/removal by $SF_6$ of the nip junction on one side was performed and a back contact was formed on it by about a five minute annealing of a silicon/aluminum paste at about 800° C. One side was protected by paraffin and the other side was subjected to the Black Etch process. The gold was removed by about a four minute ultrasonication of the wafer in a solution comprising about 25 g $I_2$ and about 100 g KI per liter of DI $H_2O$. The paraffin was then removed with trichloroethylene (TCE) and a standard palladium/silver front grid was evaporated on the front side. The volume of Black Etch reagent and metal ion solution used for each reaction was about 4 ml of each for a total volume of about 8 ml. The stability of a pre-mixed solution (with respect to time) was demonstrated to be about 2 minutes at room temperature.

An exemplary procedure entailed placing the Si wafer in about a 0.8 mM solution of $HAuCl_4$ solution with an equal volume of a 1:1 mixture of the organic modifiers, acetic acid and acetonitrile (an effective [$HAuCl_4$] of 0.4 mM) for approximately 2-minutes prior to the addition of a Black Etch solution consisting of a 1:1:1 volume ratio solution of DI $H_2O$, HF, and $H_2O_2$, and gently swirling for approximately four minutes. The size of the resultant "Purple of Cassius" nanogold particles was determined by TEM (transmission electron microscopy) to be less than about 10 nm.

Another example was followed by the addition of an equal volume of a 1:0.5:0.5 ratio of 0.8 mM $HAuCl_4$:ACN:HOAc solution with gentle swirling agitation for about minutes, 15 seconds. XPS (X-ray photoelectron spectroscopy) revealed that the particles do not contain Au(I)ions, (i.e., from AuF), but only AuO or Au. It is noted that the initial reaction solutions tested comprised of equal volumes (1:1:1) of 50/50 vol % acetonitrile/acetic acid:50 wt./vol.% HF:30 wt./vol/% $H_2O_2$, work equally well with an aqueous 0.4 mM $HAuCl_4$ solution, but needed to be used within about two hours or the HF and $H_2O_2$ in the etchant solution decomposes the acetonitrile into cyanic acid (HOCN) and methanol and renders the black-etch inactive.

The catalytic nature of the Black-Etch process was confirmed by the observation of about a four-fold rate increase with about a 20° C. increase in reaction temperature. In one embodiment, only 30-60 seconds were used to reach the same degree of Black-Etch at about 45° C. compared with about 180-240 seconds for room temperature (25° C.) reactions. Perpendicular and cross-sectional SEM studies of monocrystalline Si (100) wafers tested showed a uniform surface morphology containing an average of about 10 nm diameter cylindrical etch tunnels approximately 343 nm deep for the "standard" four minute Black-Etch.

With the heavily phosphorous diffused n-junctions implanted in p-(B) type silicon prior, the following representative results have been achieved with a fresh 1:1:1 volume ratio solution of about 50% acetonitrile/50% acetic Acid:50 wt./vol/% HF:30 wt./vol. % $H_2O_2$ in conjunction with an equal volume of a 0.4 mM $HAuCl_4$ solution for of about four minutes without ultrasonication (Black Si Etch I). These wafers exhibited a much lower reflectivity across the 350-1000 nm wavelength range ($R_{ave}$) than other methods which utilized the maximal $H_2O_2$ (7:1 HF:$H_2O_2$) 3 W 12V blue LED light assisted inorganic etch (Black Si Etch II) as shown in Table 1.

TABLE 1

| Cell Type | Jsc (mA/cm$^2$) | Voc (V) | Fill Factor | Efficiency | Rave (%) |
|---|---|---|---|---|---|
| Black Si Etch I | 33.30 | 0.570 | 0.570 | 10.84 | 1.0 |
| Black Si Etch II | 25.23 | 0.591 | 0.690 | 10.3 | 3.3 |

The low fill factor, open circuit voltage ($V_{oc}$) and efficiency is believed to result from thin metal contact on the porous surface, increasing the series resistance. However, the embodiments disclosed herein are not necessarily limited as such.

The acetic acid provides a hydrophilic hydrogen-bonded environment, which accelerates the oxidation of the silicon surface, while the acetonitrile serves as a dissociation limiter for the hydrofluoric acid and reduces or altogether eliminates the loss of too much of the diffused silicon layer, which may compromise the n-p junction.

Other methods utilized about a 3:2:1 volume ratio solution of acetic acid:50 wt./vol/% HF:30 wt./vol. % $H_2O_2$ in conjunction with an equal volume of a 0.4 mM $HAuCl_4$ solution for about two minutes (Black Si Etch III) without ultrasonication. Approximately one micron of the diffused layer junction was removed and the following cell parameters in Table 2 were achieved.

TABLE 2

| Cell Type | $J_{sc}$ (mA/cm$^2$) | $V_{oc}$ (V) | Fill Factor | Efficiency | $R_{ave}$ (%) |
|---|---|---|---|---|---|
| Black Si Etch III | 30.71 | 0.575 | 0.7366 | 13.0 | 5.3 |

In the examples, the metal stripping solution comprised about 25 g $I_2$/100 g KI per Liter DI $H_2O$ and was used for the same time (in the ultrasonic bath) and volume as for the Black Etch procedure. The effective concentration of $KI_3$ in this solution is about 0.8M. Aqua Regia 3:1 (HCL:$HNO_3$) has also been used for Au stripping, giving approximately the same residue gold according to SIMS (Secondary Ion Mass Spectrometry) profile{[Au] versus depth} for Black-etches utilizing $HAuCl_4$ as $KI_3$. A Cary-5G UV-Vis and or a Varian 6000i spectrometer equipped with a calibrated spherical reflectance chambers was used for all final reflectance measurements.

It is noted that the example discussed above is provided for purposes of illustration and is not intended to be limiting. Still other embodiments and modifications are also contemplated. While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

The invention claimed is:

1. A wet-chemical method of producing black silicon substrates, comprising:
   soaking crystalline silicon wafers in a predetermined volume of a diluted inorganic compound solution, wherein the crystalline silicon wafers comprise a dopant diffused n-p junction; and
   combining the wafers with a catalytic solution and an etchant solution wherein the etchant solution comprises an acetonitrile solution and acetic acid combined with a hydrofluoric acid and hydrogen peroxide etching solution;
   wherein the catalytic solution supplies a source of a catalytic noble metal and the combining provides a uniform and kinetically stabilized noble metal nanoparticle induced Black Etch of the silicon wafer.

2. The method of claim 1, wherein the inorganic compound solution comprises chlorauric acid.

3. The method of claim 1, wherein the wafers comprise a surface doped with n-type dopant phosphorus from phosphorous oxychloride gaseous diffusion.

4. The method of claim 1, wherein the wafers are doped with p-type dopant.

5. The method of claim 1, wherein the noble metal nanoparticle comprises gold, silver, platinum, palladium, or copper.

6. The method of claim 1, further comprising reducing reflective losses to less than about 3% across the useful solar spectrum.

7. The method of claim 1, further comprising doping the crystalline silicon wafers with n-type dopant phosphorus from phosphorous oxychloride ($POCl_3$) gaseous diffusion before the soaking.

8. The method of claim 1, further comprising producing an anti-reflective nanoporous layer on the crystal silicon wafers with the Black Etch.

9. The method of claim 1, further comprising producing Si surfaces that exhibit less than 3% reflectivity in the wavelength range of about 350-1000 nm.

10. A method comprising: combining gold-containing ionic or molecular species with a hydrogen peroxide, hydrogen fluoride, HF activity modifier and surface hydrophyllicity modifier etch; producing an anti-reflective silicon surface in a wavelength range of 350-1000 nm.

11. A wet-chemical method of producing black silicon substrates, comprising:
    soaking crystalline silicon wafers in a predetermined volume of a diluted inorganic compound solution, wherein the crystalline silicon wafers comprise a dopant diffused n-p junction; and
    combining the wafers with a catalytic solution and an etchant solution; wherein the etchant solution comprises an organic HF activity modifier and a surface hydrophyllicity modifier combined with a hydrofluoric acid and hydrogen peroxide etching solution;
    wherein the catalytic solution supplies a source of a catalytic noble metal and the combining provides a uniform and kinetically stabilized noble metal nanoparticle induced Black Etch of the silicon wafer.

12. The method of claim 11, wherein the inorganic compound solution comprises chlorauric acid.

13. The method of claim 11, wherein the wafers comprise a surface doped with n-type dopant phosphorus from phosphorous oxychloride gaseous diffusion.

14. The method of claim 11, wherein the wafers are doped with p-type dopant.

15. The method of claim 11, wherein the noble metal nanoparticle comprises gold, silver, platinum, palladium, or copper.

16. The method of claim 11, further comprising reducing reflective losses to less than about 3% across the useful solar spectrum.

17. The method of claim 11, further comprising doping the crystalline silicon wafers with n-type dopant phosphorus from phosphorous oxychloride ($POCl_3$) gaseous diffusion before the soaking.

18. The method of claim 11, further comprising producing an anti-reflective nanoporous layer on the crystal silicon wafers with the Black Etch.

19. The method of claim 11, further comprising producing Si surfaces that exhibit less than 3% reflectivity in the wavelength range of about 350-1000 nm.

* * * * *